(12) United States Patent
Marsh et al.

(10) Patent No.: US 6,760,355 B2
(45) Date of Patent: Jul. 6, 2004

(54) SEMICONDUCTOR LASER

(75) Inventors: John Haig Marsh, Glasgow (GB); Craig James Hamilton, Renfrewshire (GB)

(73) Assignee: The University Court of the University of Glasgow (GB)

( * ) Notice: Subject to any disclaimer, the term of this patent is extended or adjusted under 35 U.S.C. 154(b) by 0 days.

(21) Appl. No.: 09/916,802

(22) Filed: Jul. 27, 2001

(65) Prior Publication Data

US 2003/0021313 A1 Jan. 30, 2003

(30) Foreign Application Priority Data

Jul. 27, 2000 (GB) .............................................. 0018576

(51) Int. Cl.[7] .................................................. H01S 5/34
(52) U.S. Cl. .............................. 372/46; 372/45; 372/50
(58) Field of Search .............................. 372/45, 50, 46

(56) References Cited

U.S. PATENT DOCUMENTS

| | | | |
|---|---|---|---|
| 4,706,255 A | | 11/1987 | Thornton et al. .............. 372/50 |
| 5,238,868 A | | 8/1993 | Elman et al. ................ 438/511 |
| 5,403,774 A | | 4/1995 | Shieh et al. ................... 438/36 |
| 5,525,541 A | | 6/1996 | Krauz et al. ................... 438/38 |
| 5,699,375 A | * | 12/1997 | Paoli ........................... 372/50 |
| 5,708,674 A | * | 1/1998 | Beernink et al. .............. 372/50 |
| 5,757,023 A | * | 5/1998 | Koteles et al. ................. 257/18 |
| 5,766,981 A | | 6/1998 | Thornton et al. .............. 438/36 |
| 5,843,802 A | * | 12/1998 | Beernink et al. .............. 438/45 |
| 6,027,989 A | | 2/2000 | Poole et al. ................. 438/522 |

FOREIGN PATENT DOCUMENTS

| | | |
|---|---|---|
| EP | 0 475 330 A2 | 3/1992 |
| EP | 0 660 380 A2 | 6/1995 |
| EP | 0 660 380 A3 | 1/1996 |
| JP | 9 199 806 A | 7/1997 |

OTHER PUBLICATIONS

Edward H. Sargent et al., "Experimental Investigation of Physical Mechanisms Underlyimg Lateral Current Injection Laser Operation" Applied Physics Letters, vol. 73, No. 3, pp. 285–287, Jul. 20, 1998.

* cited by examiner

*Primary Examiner*—James W. Davie
(74) *Attorney, Agent, or Firm*—Piper Rudnick LLP

(57) ABSTRACT

There is disclosed an improved semiconductor laser device (10). Previous high power (greater than a few hundred milliwatts output) semiconductor lasers suffer from a number of problems such as poor beam quality and low brightness. The invention therefore provides a semiconductor laser device (10) including at least one portion which has been Quantum Well Intermixed (QWI) and means for providing gain profiling within an active portion of the device (10). In a preferred implementation the device (10) provides a Wide Optical Waveguide (WOW).

30 Claims, 4 Drawing Sheets

QUANTUM WELL SHAPES BEFORE QWI

QUANTUM WELL SHAPES AFTER QWI

WIDE OPTICAL WAVEGUIDE

STANDARD SINGLE MODE OPTICAL WAVEGUIDE

SEMICONDUCTOR LASER

FIELD OF INVENTION

This invention relates to semiconductor lasers, and in particular, though not exclusively, to a semiconductor laser which uses a combination of gain profiling, and Quantum Well Intermixing (QWI) and advantageously a Wide Optical Waveguide (WOW) to provide a high power semiconductor laser device which has relatively high brightness and good beam quality.

BACKGROUND TO INVENTION

Semiconductor lasers are commonly used in a number of applications, e.g. computer CD ROMs and compact disc players. High power semiconductor lasers are also used in solid-state laser pumping materials processing and medical applications. A semiconductor laser producing more than a few hundred milliwatts of light is normally termed a "high powere" device.

Previous high power semiconductor laser devices have suffered from a number of problems such as poor beam quality and low brightness. The output power is also limited due, for example, to interactions between the optical field and the laser facet (mirror).

The laser facet is cleaved semiconductor and as such contains a high density of vacancies and broken bonds which can lead to the absorption of generated light. Light absorbed at the laser facet generates heat as excited carriers recombine non-radiatively. This heat reduces the semiconductor band-gap leading to an increase in absorption inducing thermal runaway which may result in Catastrophic Optical Mirror Damage (COMD).

Many schemes have been suggested and implemented to increase COMD levels. These, for example, include facet passivation by chemical treatments and band-gap widening in the mirror regions. Band-gap widening can be achieved by re-growth processes. However, all of these schemes have proved complicated and unreliable with no single process being widely adopted.

Therefore, to produce high powers without suffering from COMD, manufacturers have previously tended to increase the width of the laser aperture. Although this increases the overall power output of the semiconductor laser, the amount of power per unit width emitted from the laser aperture is in effect reduced. Further, although this method does produce higher power, it is accompanied by a number of other disadvantages. These disadvantages include a reduction in the brightness of the device, a reduction in the quality of the laser output beam (i.e. loss of spatial coherence), and it is also more difficult to dissipate heat out of the active region of the device One of the reasons why the beam quality of previous high power devices is poor is due to the interaction of carriers with light in the active region of the device. These interactions take the form of spatial hole burning and self-phase modulation, which tend to induce changes in the refractive index. These changes in the refractive index allow modes higher than the fundamental mode to propagate resulting in a break-up of the near-field (filamentation) and hence broadening of the far-field.

It is an object of at least one aspect of the present invention to obviate or at least mitigate one or more of the aforementioned problems and/or disadvantages of the prior art It is a further object of at least one aspect of the present invention to provide a semiconductor laser device which has a relatively high brightness and good beam quality as compared to previously known semiconductor laser devices.

SUMMARY OF INVENTION

According to a first aspect of the present invention there is provided a semiconductor laser device including at least one portion which has been Quantum Well Intermixed (QWI), and means for providing gain profiling. Herein the term gain profiling is meant to mean alteration of a profile of a concentration of carriers within an active portion or region of the device. This is in contra distinction to prior laser devices where current injection is substantially uniform or constant across the active region.

This combination of techniques produces a high power device with low loss integrated spatial filters.

The device of the present invention therefore provides relatively high power and high brightness vis-a-vis prior devices.

Advantageously the device also provides a wide optical waveguide (WOW). Herein the term WOW is meant to mean a waveguide which supports more than the fundamental mode.

Preferably, the laser device is fabricated at least partly from a compound semiconductor material.

Preferably, the semiconductor device is fabricated from a III-V semiconductor based materials system, eg a Gallium Arsenide (GaAs) or Indium Phosphide (InP) system.

Preferably, the semiconductor device is fabricated at least partly from Aluminium Gallium Indium Phosphide (AlGaInP).

Preferably, the semiconductor laser device comprises a multiple layer wafer structure.

Preferably, the multiple layer wafer structure includes an optical waveguide preferably comprising an undoped high refractive index core region containing at least one Quantum Well (QW) as-grown, and bounding the core region doped cladding regions having lower refractive indices then the core region, and advantageously a further $p^{++}$ contact layer.

It is further preferred that the laser wafer structure is grown on a (100) Si doped GaAs substrate misorientated 10° to the [111] A direction.

Preferably, the at least one Quantum Well (QW) layer comprises at least one Quantum Well (QW) layer, and in one embodiment comprise a double Quantum Well (QW) layer of around 670 nm emission wavelength.

The laser wafer structure may be grown by any suitable III-V semiconductor growth method. It is preferred that the laser wafer structure is grown by Metal-Organic Vapour Phase Epitaxy using a large III-V growth ratio or Molecular Beam Epitaxy (MBE).

Preferably the multiple layer wafer structure consists of an n-doped GaAs buffer layer, an n-doped low refractive index waveguide cladding layer, an undoped high refractive index waveguide core layer, a p-doped low refractive index cladding layer, a p-doped low index barrier reduction layer, a $p^{++}$ doped GaAs capping layer, a dielectric insulation layer and a p-type contact.

In one embodiment the multiple layer wafer structure consists of a 500 nm Silicon (Si) doped ($3\times10^{18}$ cm$^{-3}$) GaAs buffer layer, a 1.0 $\mu$m Si ($6\times10^{17}$ cm$^{-3}$) doped $(Al_{0.7}Ga_{0.3})_{0.5}In_{0.5}P$ lower waveguide cladding layer, a 600 nm undoped $(Al_{0.3}Ga_{0.7})_{0.5}In_{0.5}P$ waveguide core layer, a 1.0 $\mu$m Zinc (Zn) ($6\times10^{17}$ cm$^{-3}$) doped $(Al_{0.7}Ga_{0.3})_{0.5}In_{0.5}P$ cladding layer, a Zn ($2 \times 10^{18}$ cm$^{-3}$) doped Ga$_{0.5}$In$_{0.5}$P barrier reduction layer and a 300 nm Zn (>$1 \times 10^{19}$ cm$^{-3}$) doped GaAs capping layer.

Preferably, there are a number of low band-gap Quantum Wells (QWs) substantially centrally provided in the undoped waveguide core layer as-grown.

Preferably, the low band-gap Quantum Wells (QWs) comprise two strained 6.8 nm wide Ga$_{0.5}$In$_{0.5}$P Quantum Wells (QWs) and an undoped layer therebetween comprises a 15 nm (Al$_{0.3}$Ga$_{0.7}$)$_{0.5}$In$_{0.5}$P barrier layer.

In a preferred form the device consists of at least three distinct portions:
  first and second at least one portions which are Quantum Well Intermixed (QWI) and optically passive, and
  a mid portion between the first and second at least one portion which is optically active and includes at least one Quantum Well (QW).

The mid portion therefore has a band-gap equivalent to the multiple layer wafer structure, as-grown, while the band-gap of the first and second at least one portions are blue shifted, which makes the first and second at least one portions substantially transparent to light (optical radiation) generated in the active mid portion.

Preferably, there is provided means for injecting current into the mid portion thereby providing the optical gain profiling in the device, in use.

It is preferred that the current injection means is a contact shaped as a geometric pattern, wherein the shape of the contact is selected to allow for matching of an optical mode and gain of the structure.

The contact may be shaped substantially as a half-tone pattern, finger pattern, triangular pattern or Gaussian distribution pattern.

In one form the first at least one portion is relatively short, for example, 1 to 100 µm, and acts in use as a Non-Absorbing Mirror (NAM) allowing high output powers at the device facet, and the second at least one portion is relatively long, for example, around 1 µm, and acts in use, as a spatial filter In another form both first and second at last one portions are relatively short whereby both first and second at least one portions act as NAMs and even higher power outputs are obtained. Preferably, the relatively short first and second at least one portions are 1 to 100 µm long.

According to a second aspect of the present invention there is provided a semiconductor laser device providing gain profiling and Quantum Well Intermixing (QWI).

According to a third aspect of the present invention there is provided a method of fabricating a device according to either the first or second aspect of the present invention, the method comprising the steps of:
  (a) providing a, laser device body portion including at least one Quantum Well (QW);
  (b) defining on the device body portion at least one portion to be intermixed and intermixing the Quantum Well(s) (QWs) within the at least one portion, and further
  (c) defining on the device body portion at least one optically active region and providing current injection means associated with the optically active region.
  Step (b) may be undertaken before or after step (c), though preferably before.

The intermixing step may be selected from a number of QWI techniques, eg Impurity Induced Disordering or preferably Impurity Free Vacancy Disordering (IFVD). In the latter case, preferably the process includes deposition of a dielectric layer, eg a Silica (SiO$_2$) layer, subsequent rapid thermal annealing causing semiconductor material to dissolve into the Silica thereby leaving vacancies in the semiconductor material.

According to a fourth aspect of the present invention there is provided an apparatus including at least one device according to either of the first or second aspects of the present invention.

The apparatus may comprise a CD ROM or CD player or a telecommunications apparatus.

According to a fifth aspect of the present invention there is provided a system including at least one device according to either of the first or second aspects of the present invention.

The system may comprise a telecommuncations system.

BRIEF DESCRIPTION OF DRAWINGS

An embodiment of the present invention will now be described by way of example only with reference to the accompanying drawings which are.

DETAILED DESCRIPTION OF DRAWINGS

Figure 1A:
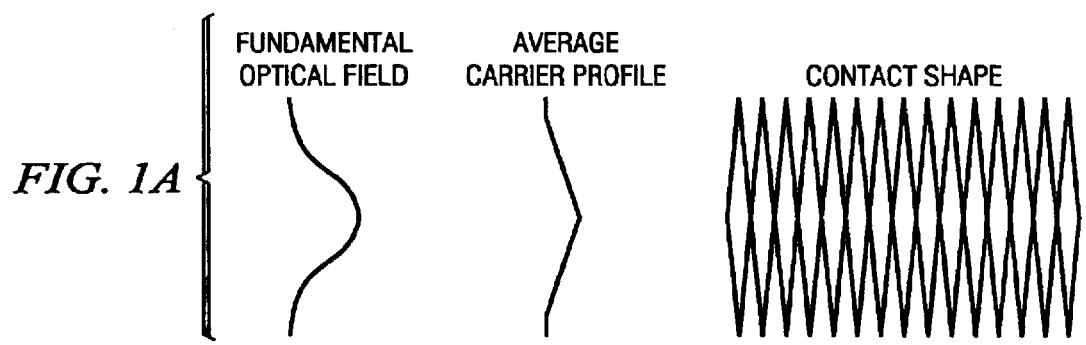
FIGS. 1A, 1B and 1C show three representations of the relation between optical field, carrier profile and contact shape.

One technique used in the present invention to provide a semiconductor laser with both high power and high brightness is to provide an Extended Cavity Laser (ECL) employing QWI. Using this technique, it is possible to produce bright single lobed far-fields by integrating slab waveguide sections onto broad area lasers (e.g. oxide stripe lasers). These effectively act as spatial mode filters, incorporating what is essentially a diffractive region within the laser cavity, and promote laser operation on a single spatial mode. The interaction of carriers with light in the device induces changes in the refractive index, and as a result light filaments form. Due to the high refractive index changes associated with the filaments, light influenced by the filaments experiences larger diffraction angles than the fundamental mode of the device. Therefore, the filaments experience greater diffraction losses than the fundamental mode as they propagate across the slab waveguide region. The fundamental mode will therefore have a greater overlap with the gain region and be selectively amplified. Although these ECL devices produce a good quality beam, using present production methods, they are limited to relatively low output powers. The limitations arise from reliability problems with QWI resulting from the dielectric cap materials (such as SrF$_2$) used and the high temperature anneals involved (>900° C.). Although this device has been produced by using a new QWI process, due to high losses in the passive sections output, the external efficiency is low, and thus output power is limited.

A further technique used in the present invention to provide a high power semiconductor laser device is to use a Wide Optical Waveguide (WOW) High power semiconductor laser devices have previously relied on standard wafer structures. These use the design principle of maximising the overlap of the optical mode and Quantum Wells (ie the gain) of the structure. This overlap is denoted as Γ.

The use of WOW structures (also known as Large Optical Cavity (LOC)), overcome previous problems by providing structures that do not maximise Γ but minimise the loss of the structure (α). Following this route, it is possible to reduce the loss by more than the reduction of Γ which has the net effect of increasing the overall modal gain of the structure. Theoretically, these WOW structures can support more than one optical mode. However, since all of the WOW semiconductor structures gain is placed in the middle of the waveguide in the Quantum Wells, only the even modes see this gain and can effectively extract it. Also, as the order of the modes increase, they have more overlap with the doped cladding layers of the structure, and hence experience increased loss. Both of these factors ensure that the structure remains single moded in the vertical direction. Using these types of designs, it is possible to design devices that have single mode field profiles that are wider than normal, which increases the COMD level. Use of WOW's in devices of the present invention, significantly reduces losses in passive regions making the device more efficient.

Although these WOW designs allow reduced optical losses, the device can still suffer from reduced performance at higher current injection levels. This is due to the fact that fundamental modes of broad area semiconductor layers have a Gaussian distribution of both the near and far-fields, whereas the injected carriers and thus the gain profile have a "top-hat" distribution.

Another technique used in the present invention to seek to enhance the beam profile from a semiconductor lasers is gain profiling. The fundamental mode of broad area semiconductor layers have a Gaussian distribution of the near and far-fields. Gain profiling uses various methods to match the spatial distribution of injected carriers (and therefore also the gain) to the optical field distribution. This allows the fundamental mode to be selectively amplified in the laser resonator. Various schemes are envisaged. These include, for example, shaping contacts using half-tone or truncated finger designs where the spacing between contacts is of the order of the diffusion of the electrical carriers injected into the structure.

In a broad area semiconductor laser the fundamental distribution of light in the plane of the injection contact is Gaussian shaped. However, as higher currents are injected the mode breaks up and filaments form, which decreases the brightness of the laser. This is because the contact is typically a rectangular shape, which gives rise to a rectangular profile of injected carriers, which is the subsequent profile of the gain within the device. Therefore the overlap between the gain and the fundamental mode of the optical field does not match which leads to the fundamental optical mode not extracting the gain efficiently. This results in a build up of excess carriers. These excess carriers induce complicated nonlinear interactions within the device, and the optical field becomes irregular and forms filaments which degrade the beam quality of the device.

Further, these filaments can induce large localised intensities resulting in COMD. To prevent this occurrence, it is advantageous to match the gain with the required optical field. A technique for doing this is to inject the required amount of carriers in to each part of the contact to give the correct spatial distribution of carriers. One way of achieving this is to utilise a shaped contact on top of the device. This works by using electrical contacts which have both carrier injection and non-injection areas possessing dimensions that are of the same order of the carrier diffusion within the waveguide layers. As a result, as the carriers diffuse into the device they spread out to form a continuous sheet of carriers that has a density which is graded to match the fundamental optical mode. The preferred shape of contact is one that generates a Gaussian distribution of carriers. However as this can be quite difficult to generate, other shapes are envisaged, including triangular and truncated triangles as these offer easier options for fabrication.

Passive sections of the ECL have an advantage in that they operate as non-absorbing mirrors (NAM's) which enables higher laser diode output powers to be obtained due to the mirror facet being transparent to the generated light. COMD levels can then be raised since there is reduced absorption of light at mirror facets, which avoid thermal runaway of temperature. In standard devices (without NAM's) current flow through the mirror region also reduces the band-gap which in turn increases in absorption are avoided through the use of NAM's as they are not subject to current injection. NAM's are implemented in many formats with some degree of success. These implementations have typically relied on some type of Impurity Induced Diffusion (IID) which has proven successful for increasing the band-gap, but suffers from free carrier absorption, and is therefore limited to producing relatively short NAM sections. It is also difficult to perform IID in the AlGaInP material system due to its very high thermal stability.

Although these passive sections are low loss through the use of QWI, in standard single mode laser structures the overlap of the optical field with the waveguide cladding regions are large. This can lead to relatively high waveguide losses for two reasons. Firstly, the passive regions are intentionally doped to provide a p-n junction and therefore contribute to the free carrier absorption of the waveguide. Secondly, the refractive index fluctuations at the interface between the waveguide core and cladding causes scattering losses.

Figure 1B:
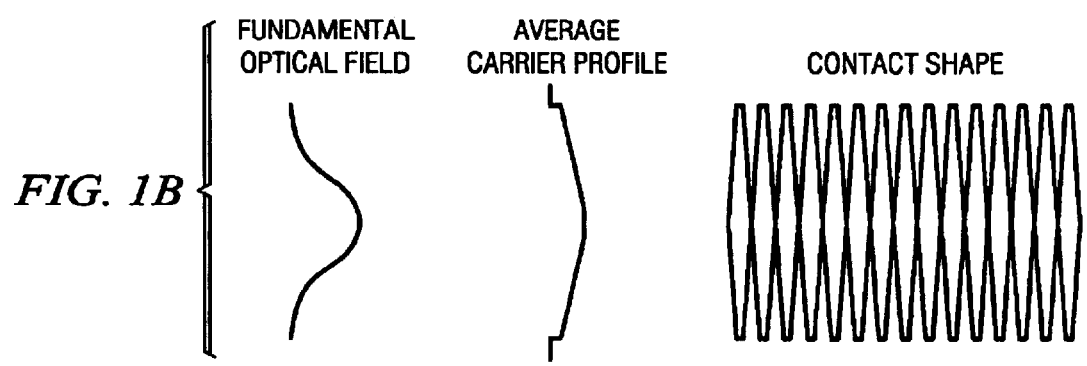
Figure 1C:
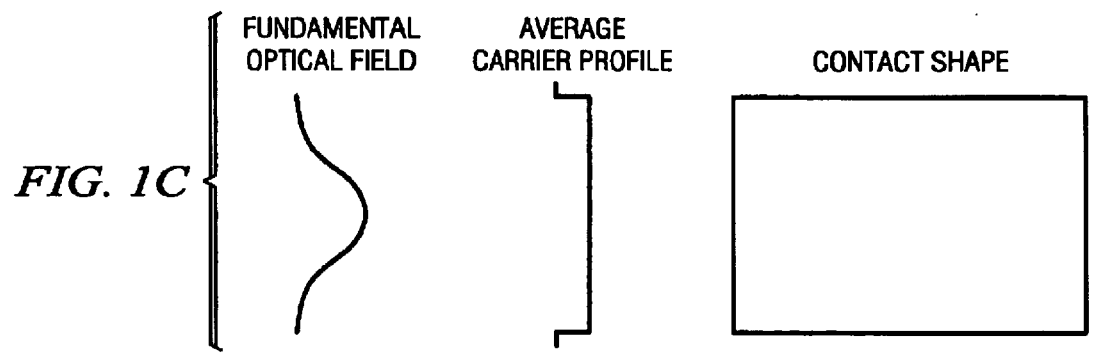

Turning now to the diagrams, FIGS. 1A–1C show overlap between the gain and the fundamental mode of the optical field within an optical waveguide. FIG. 1C shows the situation where the gain does not match the fundamental mode of the optical field, as in the prior art. Using a shaped contact as in the present invention, as in FIGS. 1A and 1B, a better overlap is obtained.

Figure 2A:
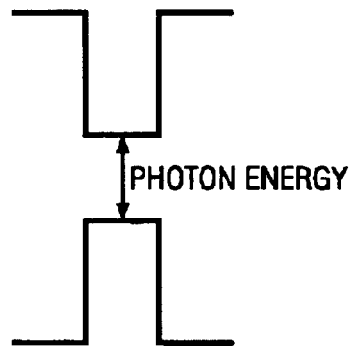
FIGS. 2(a) & (b) a representation of the effect of QWI.
Figure 2B:
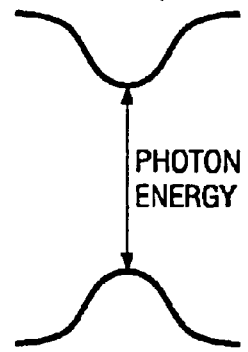

FIGS. 2A and 2B show the effect of QWI whereby the wells and barriers of Quantum Well structures are intermixed. As can be seen in FIGS. 2A and 2B, the QWI smears out the energy profile of the two Quantum Wells reducing the quantum confinement of the wells within the laser structures, and simultaneously incur the effective band gap of the Quantum Wells which also lowers the optical losses in these sections. In the case of impurity free intermixing there is no added optical losses through the incorporation of the impurities that add to free carrier absorption.

Figure 3:
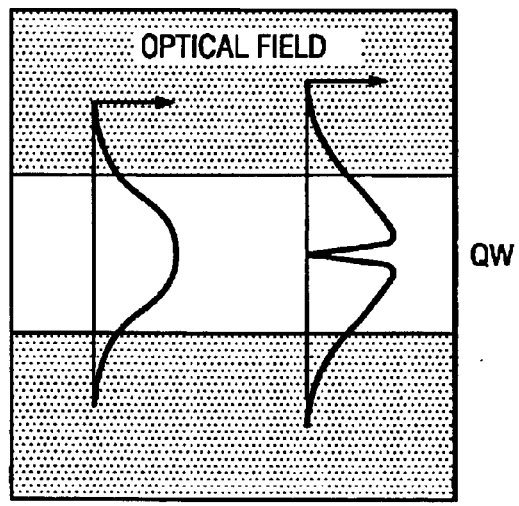
FIG. 3 a representation of optical fields within a WOW.
Figure 3:
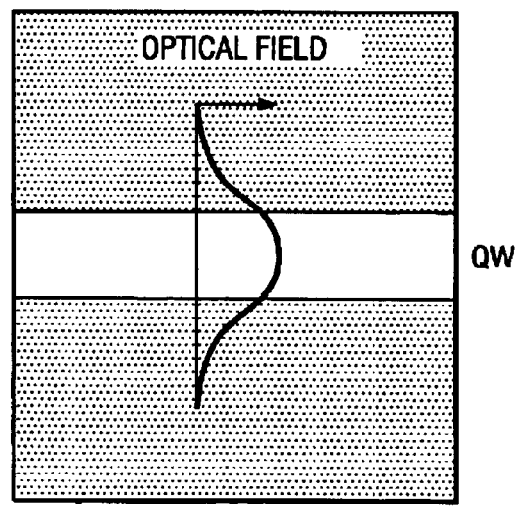

FIG. 3 shows the wide optical waveguide structure wherein the overall modal gain is increased. Although the WOW structures can support more than one optical mode, because all of the gain is placed in the middle of the waveguide ie in the Quantum Wells, only the even modes see this gain and can extract it effectively. Furthermore, as the order of the modes increase, they have more overlap with the cladding layers of the structure and hence experience increased loss. As shown in FIG. 3, this helps to ensure that the structure remains single moded in the vertical direction.

Figure 4:
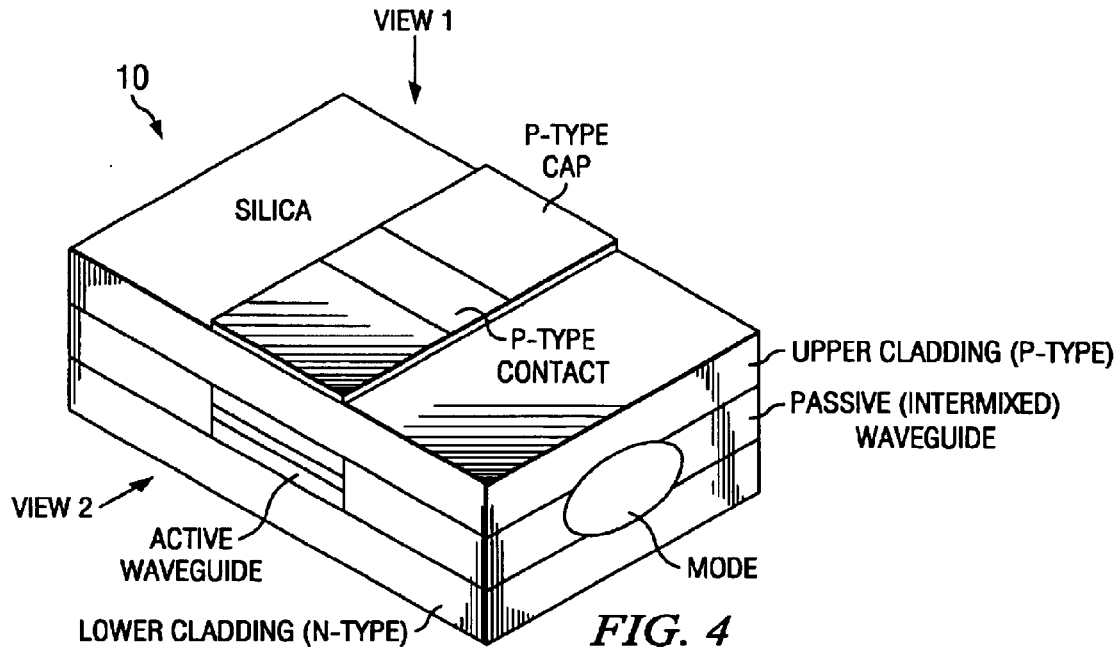
FIG. 4 a perspective view of a semiconductor laser device according to an embodiment of the present invention.
Figure 5:
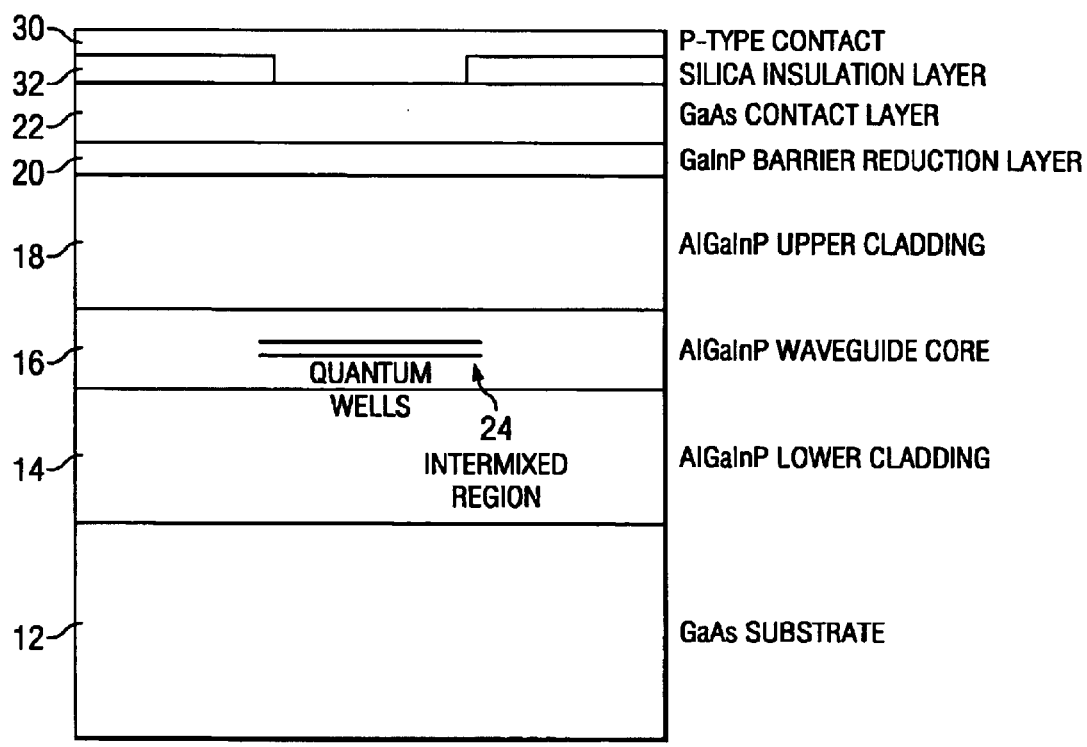
FIG. 5 a side view of the semiconductor laser device of FIG. 4.

As shown in FIGS. 4 and 5, a semiconductor device 10 according to an embodiment of the present invention is formed from a laser wafer structure fabricated in AlGaInP material. It should however, be noted that other III-V semiconductor materials can also be used.

The laser wafer structure is a standard 670 nm double Quantum Well layer which has been grown on a (100) Si doped GaAs substrate 12 misorientated 10° to the [111] A direction. The wafer may be grown by metal-organic vapour phase epitaxy, using a large III-V growth ratio. The misorientated GaAs substrate along with high growth temperature is used to inhibit the occurrence of long-range ordering.

As shown in FIG. 5, the device 10 consists of a GaAs substrate 12 which has a depth of 500 µm and is Si doped ($3 \times 10^{18}$ cm$^{-3}$) On the substrate 12 there is a 1 µm Si ($6 \times 10^{17}$ cm$^{-3}$) doped $(Al_{0.7}Ga_{0.3})_{0.5}In_{0.5}P$ first waveguide cladding layer 14. On the first waveguide cladding layer there is a 600 nm undoped $(Al_{0.3}Ga_{0.7})_{0.5}In_{0.5}P$ waveguide core layer 16. Further, on the waveguide core layer 16 there is a 1 µm $Zn(6 \times 10^{17}$ cm$^{-3}$) doped $(Al_{0.7}Ga_{0.3})_{0.5}In_{0.5}P$ second waveguide cladding layer 18. On the second cladding waveguide cladding layer there is a $Zn(2 \times 10^{18}$ cm$^{-3}$) doped $Ga_{0.5}In_{0.5}P$ barrier reduction layer 20. On the barrier reduction layer 20 there is a 300 nm $Zn(>1 \times 10^{19}$ cm$^{-3}$) doped GaAs capping 22 (i.e. contact layer). On the capping layer 22 there is a dielectric insulation layer 32. As shown in FIGS. 4 and 5 on semiconductor device 10 there is a further p-type contact 30.

As shown in FIG. 5, within the waveguide region 16 there are two strained 6.8 nm wide $Ga_{0.5}In_{0.5}P$ Quantum Wells 24. In this embodiment these Quantum Wells 24 are substantially centrally placed in the core layer 16, and are separated by a 15 nm $(Al_{0.3}Ga_{0.7})_{0.5}In_{0.5}P$ barrier (not shown).

Figure 6:
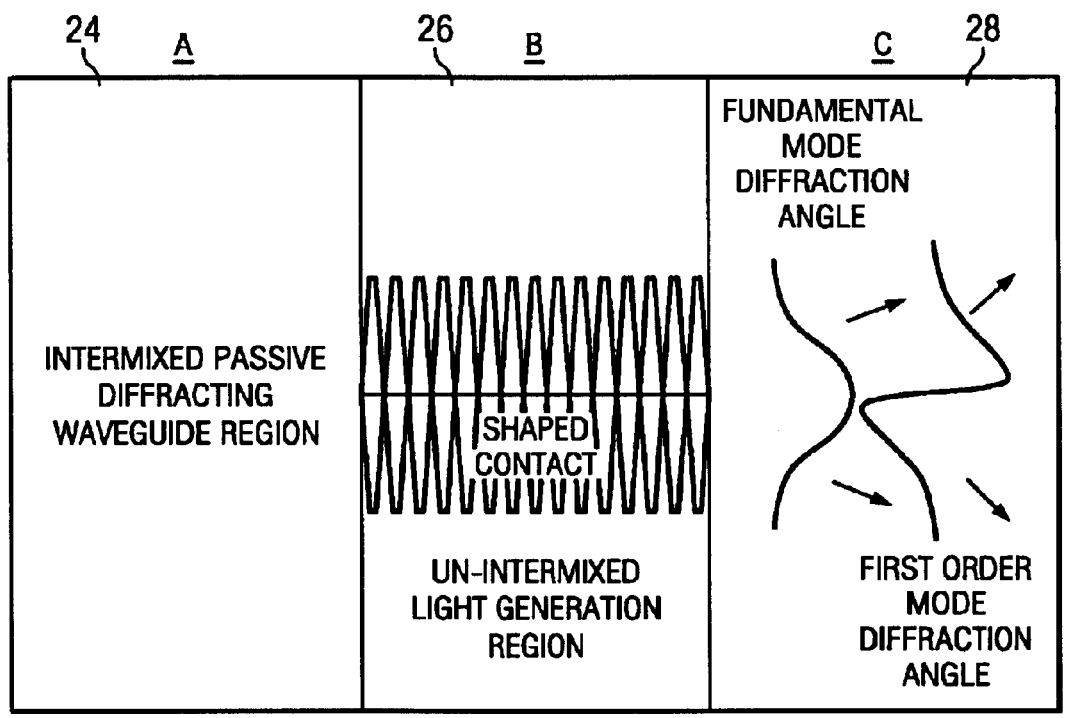
FIG. 6 a top view of the semiconductor laser device of FIG. 4.

FIG. 6 shows the semiconductor device 10 consisting of in principle three portions 24, 26, 28. Two of these portions 24, 28 are intermixed and passive and have a high energy band-gap as compared to the as grown material in mid portion 28 The blue shifting of the intermixed and passive portions 24, 28 render them transparent to light generated in the active region 26. In portion 28, the first-order mode diffraction angle is shown in FIG. 6.

In operation, the mid portion 26 of approximately 100× 1000 µm is injected with current and provides the gain of the device. As shown in FIG. 6 the middle section 26 has a shaped p-type contact formed from either a half-tone or finger pattern. The p-type contact 30 in FIG. 5 does not show this shape). The shape of the p-type contact 30 is selected to enable matching of the optical mode and the gain of the structure. It can possess a triangular shape, Gaussian or any other geometrical distribution.

One of the passive sections 24 may be short (10–100 µm) and acts as a NAM allowing high output powers at the device facet. The other passive section 28 may be much longer, (approximately 1 mm) and act as a spatial filter.

Both passive sections may also be short (10–100 µm) to enable higher outputs to be obtained. Higher outputs are therefore obtained by having NAM's on the ends of the fingers. There is, however, a decrease in the quality of the beam. The NAM's are too short to provide significant spatial filtering.

The semiconductor laser device 10 (ECL) is fabricated using standard procedures. To fabricate an ECL a sample may be cleaned and masked with photo-resist to protect areas where intermixing is not required, a layer of sputtered $SiO_2$ is then deposited onto the sample. Sputtered $SiO_2$ deposited on the masked regions is removed by lift-off in acetone and the whole sample is coated with a layer of electron beam or plasma enhanced chemical vapour deposition (PECVP) evaporated $SiO_2$ to protect the areas from which the sputtered $SiO_2$ was removed The sample is then annealed in a Rapid Thermal Annealer (RTA). Photolithography and dry etching are used to define the gain sections on the middle area where QWI has not taken place. Finally the sample is thinned and p- and n-type contacts are deposited by electron beam evaporation and then annealed.

Finally, it will be appreciated that the embodiment of the invention hereinbefore described is given by way of example only, and is not meant to limit the scope thereof in any way.

What is claimed is:

1. A semiconductor laser device, comprising:
   an optical waveguide;
   an optically active region of the optical waveguide in which light is generated in a predetermined optical field having a nonuniform intensity which varies as a function of position within the active region, at least one first subregion of the active region having generated therein a first light intensity, at least a second subregion of the active region having generated therein a second light intensity less than the first light intensity;
   an optically passive region of the optical waveguide formed by quantum well intermixing; and
   means for providing gain profiling, said means including a shaped carrier injection contact formed to be coupled to the active region and having a surface contact area, more of the surface contact area of the contact being formed adjacent the first subregion of the active region and less of the surface contact area of the contact being formed adjacent the second subregion of the active region.

2. A semiconductor laser device as claimed in claim 1, wherein the optical waveguide is a slab wide optical waveguide (WOW).

3. A semiconductor laser device as claimed in claim 1, wherein the semiconductor laser device is fabricated at least partly from compound semiconductor materials.

4. A semiconductor laser device as claimed in claim 3, wherein the compound semiconductor materials are III-V semiconductor based materials.

5. A semiconductor laser device as claimed in claim 4, wherein the III-V semiconductor based materials comprise Gallium Arsenide (GaAs) based materials.

6. A semiconductor laser device as claimed in claim 4, wherein the III-V semiconductor based materials include Aluminum Gallium Indium Phosphide (AlGaInP).

7. A semiconductor laser device as claimed in claim 1, wherein the semiconductor laser device comprises a multiple layer wafer structure.

8. A semiconductor laser device as claimed in claim 7, wherein the multiple layer wafer structure incorporates an optical waveguide comprising an undoped high refractive index core region containing at least one Quantum Well (QW) as-grown, and bounding the core region doped cladding regions having lower refractive indices than the core region.

9. A semiconductor laser device as claimed in claim 8, wherein the laser wafer structure contains at lease one Quantum Well layer structure as grown, and is grown on a (100) Si doped GaAs substrate misoriented 10° to the [111] A direction.

10. A semiconductor laser device as claimed in claim 8, wherein the Quantum Well layers comprise at least one double Quantum Well layer.

11. A semiconductor laser device as claimed in claim 10, wherein the Quantum Well layers have an emission wavelength as-grown of the order of 670 ηm.

12. A semiconductor laser device as claimed in claim 7, wherein the multiple layer wafer structure consists of an Si doped GaAs buffer layer, an n-doped low refractive index waveguide cladding layer, an undoped high refractive index waveguide core layer, a p-doped cladding layer, a p-doped low refractive index barrier reduction layer, a $p^{++}$ doped GaAs capping layer, a dielectric insulation layer and a p-type contact.

13. A semiconductor laser device as claimed in claim 7, wherein the multiple structure consists of a 500 nm Si doped ($3 \times 10^{18}$ cm$^{-0.3}$) GaAs buffer layer, a 1.0 $\mu$m Si ($6 \times 10^{17}$ cm$^{-3}$) doped $(Al_{0.7}Ga_{0.3})_{0.5}In_{0.5}P$ lower waveguide cladding layer, a 600 nm undoped $(Al_{0.3}Ga_{0.7})_{0.5}In_{0.5}P$ waveguide core layer, a 1.0 $\mu$m Zn ($6 \times 10^{17}$ cm$^{-3}$) doped $(Al_{0.7}Ga_{0.3})_{0.5}In_{0.5}P$ cladding layer, a Zn ($2 \times 10^{18}$ cm$^{-3}$) doped $Ga_{0.5}In_{0.5}P$ barrier reduction layer and a 300 nm Zn (>$1 \times 10^{19}$ cm$^{-3}$) doped GaAs capping layer.

14. A semiconductor laser device according to claim 8, wherein a number of low band-gap Quantum Wells are substantially centrally placed in the undoped core region.

15. A semiconductor laser device as claimed in claim 14, wherein the low band-gap Quantum Wells comprise two strained 6.8 nm wide $Ga_{0.5}In_{0.5}P$ Quantum Wells and an undoped layer comprising a 15 nm $(Al_{0.3}Ga_{0.7})_{0.5}In_{0.5}P$ barrier.

16. A semiconductor laser device as claimed in claim 1, which includes three separate portions:
first and second at least one portions which are Quantum Well Intermixed (QWI) and optically passive, and
the optically active region being a mid portion between the first and second at least one portions and including at least one Quantum Well.

17. A semiconductor laser device as claimed in claim 16, wherein the first at least one optically passive portion acts, in use, as a Non-Absorbing Mirror (NAM) and the second at least one optically passive portion acts, in use, as a spatial filter.

18. A semiconductor laser device as claimed in claim 16, wherein the first and second at least one passive portions act, in use, as Non-Absorbing Mirrors (NAM).

19. The semiconductor laser device of claim 1, wherein the optically passive region is formed adjacent the optically active region, the optically passive region having an increased bandgap.

20. A semiconductor laser device comprising:
an optical waveguide;
an optically active region of the optical waveguide in which light is generated in a predetermined optical field having a nonuniform intensity which varies as a function of position within the active region;
an optically passive portion of the optical waveguide formed by quantum well intermixing; and
means for providing gain profiling coupled to the optically active region for injecting carriers into the optically active region, said means injecting carriers into the optically active region in a nonuniform spatial distribution.

21. A semiconductor laser device as claimed in claim 20, wherein said means for injecting carriers into the optically active region provides optical gain profiling in the device in use.

22. A semiconductor laser device as claimed in claim 17, wherein the carrier injection means is shaped as a geometric pattern, the shape of the carrier injection means being selected to allow for matching of the optical mode and gain of the device.

23. The semiconductor laser device of claim 20, wherein said means for injecting injects carriers into the optically active region in a distribution which approximates a distribution of said optical field.

24. The semiconductor laser device of claim 20, wherein the optically passive region is formed adjacent the optically active region, the optically passive region having an increased bandgap.

25. A semiconductor laser device, comprising:
an optical waveguide;
an optically active region of the optical waveguide in which light is generated in an optical field;
an optically passive region of the optical waveguide formed by quantum well intermixing; and
means for providing gain profiling coupled to the active region for injecting carriers into the active region, said means selectively amplifying a fundamental mode of said optical field.

26. The semiconductor laser device of claim 25, wherein said means comprises a contact coupled to the optically active region and shaped for generating a spatial distribution of injected carriers sufficiently matched to the distribution of said fundamental mode that the fundamental mode is selectively amplified in preference to higher order modes of the optical field.

27. The semiconductor laser device of claim 25, wherein the device further includes a spatial mode filter formed adjacent the optically active region, the spatial mode filter preferentially selecting for single spatial mode operation.

28. The semiconductor laser device of claim 27, wherein the spatial mode filter is an optically passive region of the waveguide.

29. A semiconductor laser device, comprising:
a wide optical waveguide formed around an axis of symmetry;
an optically active region of the waveguide generating an optical field in a fundamental mode having a maximum on said axis and a Gaussian optical field distribution;
an optically passive region of the waveguide formed by quantum well intermixing; and
means for providing gain profiling including a shaped carrier injection contact having a surface contact area coupled to the optically active region, a geometric distribution of said surface contact area being concentrated near said axis and approximating said optical field distribution.

30. A semiconductor laser device as claimed in claim 29, wherein the contact is shaped in a half-tone, finger pattern, triangular or Gaussian distribution.

* * * * *

UNITED STATES PATENT AND TRADEMARK OFFICE
CERTIFICATE OF CORRECTION

PATENT NO. : 6,760,355 B2
DATED : July 6, 2004
INVENTOR(S) : John Haig Marsh et al.

It is certified that error appears in the above-identified patent and that said Letters Patent is hereby corrected as shown below:

<u>Title page,</u>
Item [75], delete "John Haig Marsh, Glasgow (GB); Craig James Hailton, Renfrewshire (GB)" insert therefor: -- John Haig Marsh, Glasgow (GB); Craig James Hailton, Renfrewshire (GB); Olek Peter Kowalski, Renfrewshire (GB) --

Signed and Sealed this

Fourteenth Day of December, 2004

JON W. DUDAS
*Director of the United States Patent and Trademark Office*